(12) United States Patent
Suzuki et al.

(10) Patent No.: US 7,776,740 B2
(45) Date of Patent: Aug. 17, 2010

(54) METHOD FOR INTEGRATING SELECTIVE LOW-TEMPERATURE RUTHENIUM DEPOSITION INTO COPPER METALLIZATION OF A SEMICONDUCTOR DEVICE

(75) Inventors: Kenji Suzuki, Guiderland, NY (US); Miho Jomen, Watervliet, NY (US); Jonathan Rullan, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 12/018,074

(22) Filed: Jan. 22, 2008

(65) Prior Publication Data

US 2009/0186481 A1 Jul. 23, 2009

(51) Int. Cl.
*H01L 21/44* (2006.01)
(52) U.S. Cl. ............... 438/674; 438/686; 257/E21.121
(58) Field of Classification Search ............... 438/650, 438/665, 674, 686; 257/E21.121
See application file for complete search history.

(56) References Cited

U.S. PATENT DOCUMENTS

| | | | |
|---|---|---|---|
| 4,851,895 A | 7/1989 | Green et al. | |
| 4,929,468 A | 5/1990 | Mullendore | |
| 4,938,999 A | 7/1990 | Jenkin | |
| 5,171,610 A | 12/1992 | Liu | |
| 5,372,849 A | 12/1994 | McCormick et al. | |
| 6,063,705 A | 5/2000 | Vaartstra | |
| 6,074,945 A | 6/2000 | Vaartstra et al. | |
| 6,077,780 A | 6/2000 | Dubin | |
| 6,232,230 B1 | 5/2001 | Iacoponi | |
| 6,242,349 B1 | 6/2001 | Nogami | |
| 6,287,435 B1 | 9/2001 | Drewery | |
| 6,303,809 B1 | 10/2001 | Chi et al. | |
| 6,319,832 B1 | 11/2001 | Uhlenbrock et al. | |
| 6,420,583 B1 | 7/2002 | Lienhard et al. | |
| 6,440,495 B1 | 8/2002 | Wade et al. | |
| 6,444,263 B1 | 9/2002 | Paranjpe et al. | |
| 6,605,735 B2 | 8/2003 | Kawano et al. | |
| 6,713,373 B1 | 3/2004 | Omstead | |
| 6,989,321 B2 | 1/2006 | Yamasaki et al. | |
| 7,107,998 B2 | 9/2006 | Greer et al. | |
| 7,264,846 B2 | 9/2007 | Chang et al. | |
| 7,270,848 B2 | 9/2007 | Suzuki et al. | |
| 7,279,421 B2 | 10/2007 | Suzuki | |
| 7,285,308 B2 | 10/2007 | Hendrix et al. | |

(Continued)

FOREIGN PATENT DOCUMENTS

CA 2206217 11/1998

(Continued)

OTHER PUBLICATIONS

Czekaj, C., et al. Inorganic Chemistry, 1988, 27, p. 8-10.

(Continued)

*Primary Examiner*—W. David Coleman

(57) ABSTRACT

A method for integrating low-temperature selective Ru metal deposition into manufacturing of semiconductor devices to improve electromigration and stress migration in bulk Cu metal. The method includes providing a patterned substrate containing a recessed feature in a dielectric layer, where the recessed feature is at least substantially filled with planarized bulk Cu metal, heat-treating the bulk Cu metal and the dielectric layer in the presence of $H_2$, $N_2$, or $NH_3$, or a combination thereof, and selectively depositing a Ru metal film on the heat-treated planarized bulk Cu metal.

19 Claims, 7 Drawing Sheets

U.S. PATENT DOCUMENTS

| | | |
|---|---|---|
| 7,288,479 B2 | 10/2007 | Suzuki |
| 7,459,396 B2 | 12/2008 | Suzuki et al |
| 2003/0129306 A1 | 7/2003 | Wade et al. |
| 2005/0110142 A1 | 5/2005 | Lane et al. |
| 2006/0113675 A1 | 6/2006 | Chang et al. |
| 2006/0121733 A1 | 6/2006 | Kilpela et al. |
| 2006/0131751 A1 | 6/2006 | Minamihaba et al. |
| 2006/0199372 A1 | 9/2006 | Chung et al. |
| 2006/0220248 A1 | 10/2006 | Suzuki |
| 2006/0273431 A1 | 12/2006 | He et al. |
| 2007/0059502 A1 | 3/2007 | Wang et al. |
| 2007/0072415 A1 | 3/2007 | Suzuki |
| 2007/0099422 A1 | 5/2007 | Wijekoon et al. |
| 2007/0284736 A1 | 12/2007 | Yang et al. |
| 2008/0081464 A1 | 4/2008 | Matsuda |

FOREIGN PATENT DOCUMENTS

| | | |
|---|---|---|
| EP | 0620291 A1 | 10/1994 |
| JP | 2004146516 A | 5/2004 |
| WO | WO 00/12777 | 3/2000 |
| WO | WO0026432 A1 | 5/2000 |
| WO | WO2005034223 A1 | 4/2005 |
| WO | 2006046386 A | 5/2006 |
| WO | 2006104853 A | 10/2006 |

OTHER PUBLICATIONS

Wang et al., Low-temperature chemical vapor deposition and scaling limit of ultrathin Ru films, Applied Physics Letters, Feb. 23, 2004, p. 1380-1382, vol. 84, No. 8, American Institute of Physics, Melville, NY.

Boyd, Edwin P., et al., "Chemical Vapor Deposition of Metallic Thin Films Using Homonuclear and Heteronuclear Metal Carbonyls", Chem. Mater. 1997, 9, pp. 1154-1158.

Green, M.L., et al., "Chemical Vapor Deposition of Ruthenium and Ruthenium Dioxide Films", Journal of the Electrochemical Society, vol. 132, No. 11, pp. 2677-2685.

Cheng, Wei-Yuan, et al., "Initial growth of chemical-vapor-deposited Ru from bis(hexafluoroacetylacetonate)dicarbonyl ruthenium", Thin Solid Films 483 (2005) pp. 31-37.

Gatineau, Julien, et al., "Deposition of highly pure ruthenium thin films with a new metal-organic precursor", Surface and Coatings Technology 201 (2007), pp. 9146-9148.

Bykov, A.F., et al., "Investigation of Thermal Properties of Ruthenium(III) B-Diketonate Precursors for Preparation of RuO2 Films by CVD", Journal of Thermal Analysis, vol. 46 (1996) pp. 1551-1565.

European Patent Office, International Search Report and Written Opinion for corresponding PCT Application No. PCT/US2009/031414, dated Apr. 29, 2009, 14 pages.

United States Patent and Trademark Office, International Search Report and Written Opinion in PCT Application No. PCT/US2009/5/058689 corresponding to related case U.S. Appl. No. 12/240,894, dated Nov. 16, 2009, 7 pages.

European Patent and Trademark Office, International Search Report and Written Opinion in PCT Application No. PCT/IB2008/003805 corresponding to related case U.S. Appl. No. 11/853,393, dated Jun. 19, 2009, 16 pages.

European Patent and Trademark Office, International Search Report and Written Opinion in PCT Application No. PCT/IB2009/050910, corresponding to related case U.S. Appl. No. 11/853,393, dated Jul. 2, 2009, 14 pages.

United States Patent and Trademark Office, Non-Final Office Action issued Apr. 13, 2009 in related case U.S. Appl. No. 11/693,298, 14 pages.

Chen, "Novel Post Electroplating In-Situ Rapid Annealing Process for Advanced Interconnect Application," IEEE, 2000, pp. 194-196.

United States Patent and Trademark Office, Final Office Action issued Dec. 22, 2009 in related case U.S. Appl. No. 11/693,298, 13 pages.

METHOD FOR INTEGRATING SELECTIVE LOW-TEMPERATURE RUTHENIUM DEPOSITION INTO COPPER METALLIZATION OF A SEMICONDUCTOR DEVICE

CROSS REFERENCE TO RELATED APPLICATIONS

The present invention is related to U.S. patent application Ser. No. 11/693,298, entitled METHOD OF FORMING LOW RESISTIVITY COPPER FILM STRUCTURES. The present invention is related to U.S. patent application Ser. No. 11/853,393, entitled METHOD FOR INTEGRATING SELECTIVE RUTHENIUM DEPOSITION INTO MANUFACTURING OF A SEMICONDUCTOR DEVICE. The entire contents of these applications are incorporated herein by reference. The related applications are commonly-owned.

FIELD OF THE INVENTION

The present invention relates to semiconductor processing and semiconductor devices, and more particularly, to a method of selective deposition of ruthenium metal films for manufacturing semiconductor devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of copper (Cu) metal in multilayer metallization schemes for manufacturing integrated circuits has created several problems that require solutions. For example, high mobility of Cu atoms in dielectric materials and Si can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials (e.g., capping layer) which is directly correlated to adhesion at these interfaces. New capping materials that provide better adhesion and better EM lifetime have been studied extensively. For example, a cobalt-tungsten-phosphorus (CoWP) layer has been selectively deposited on bulk Cu metal using an electroless plating technique. The interface of CoWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal layers that provide good adhesion to Cu and improved EM and SM properties of bulk Cu metal. In particular, these methods should provide good selectivity for metal deposition on metal surfaces compared to dielectric surfaces.

SUMMARY OF THE INVENTION

Embodiments of the invention provide a method for integrating low-temperature selective Ru deposition into manufacturing of semiconductor devices to improve electromigration and stress migration in Cu metallization. According to one embodiment of the invention, a patterned substrate contains one or more dual damascene interconnect structures containing one or more trenches and one or more vias.

According to one embodiment of the invention, the method includes: providing a patterned substrate containing a recessed feature in a dielectric layer, where the recessed feature is at least substantially filled with planarized bulk Cu metal; heat-treating the bulk Cu metal and the dielectric layer in the presence of $H_2$, $N_2$, or $NH_3$, or a combination thereof; and selectively depositing a Ru metal film on the heat-treated planarized bulk Cu metal.

According to one embodiment of the invention, the method includes: providing a patterned substrate containing a recessed feature in a dielectric layer, where the recessed feature is at least substantially filled with planarized bulk Cu metal; heat-treating the bulk Cu metal and the dielectric layer at a substrate temperature below 200° C. in the presence of $H_2$; and selectively depositing a Ru metal film on the heat-treated planarized bulk Cu metal by exposing the patterned substrate to the process gas containing $Ru_3(CO)_{12}$ precursor vapor and a CO gas in a thermal chemical vapor deposition process.

According to one embodiment of the invention, the method includes: providing a patterned substrate containing a recessed feature in a dielectric layer, where the recessed feature is at least substantially filled with planarized bulk Cu metal; heat treating the bulk Cu metal and the dielectric layer at a substrate temperature below 200° C. in the presence of $N_2$ or $NH_3$, or a combination thereof; and selectively depositing a Ru metal film on the heat-treated planarized bulk Cu metal by exposing the patterned substrate to the process gas containing $Ru_3(CO)_{12}$ precursor vapor and a CO gas in a thermal chemical vapor deposition process.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method for integrating low-temperature selective Ru metal deposition into manufacturing of semiconductor devices to improve electromigration (EM) and stress migration (SM) in Cu metallization. The Ru metal films may be utilized as adhesion layers in contact with metallization layers and bulk Cu metal in interconnect structures to improve EM and SM properties of the Cu metallization. One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Figure 1A:
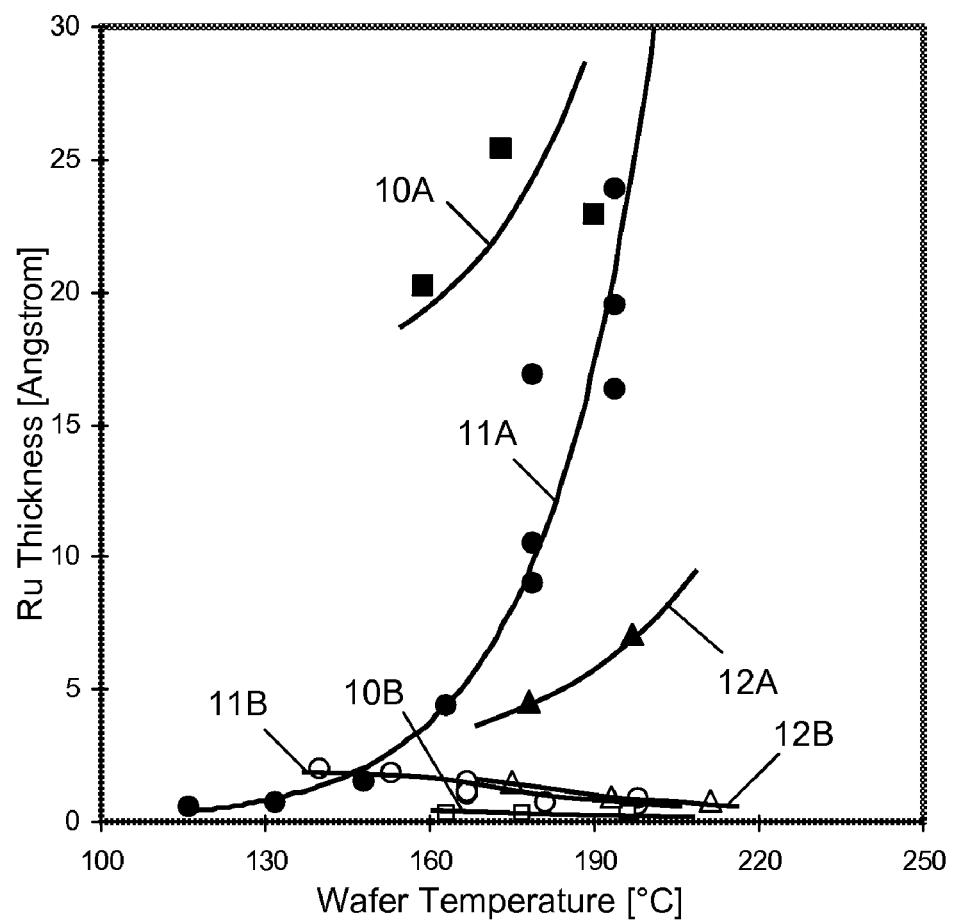
FIG. 1A shows thickness of Ru metal films deposited on wafers containing Cu metal and a low dielectric constant (low-k) material as a function of wafer temperature and process pressure according to embodiments of the invention.

FIG. 1A shows thickness of Ru metal films (in Angstrom, ($10^{-10}$ m)) deposited on wafers containing Cu metal and Si-containing low-k material as a function of wafer temperature (in degrees C, ° C.) and process pressure in a process chamber for depositing the Ru metal film according to embodiments of the invention. The wafers containing either the Cu metal or the low-k material (k=2.4) were pre-treated prior to Ru metal deposition by heat-treating in $H_2$ gas for 1 min at a process pressure of 3 Torr. Following the pre-treating, the substrates were exposed to a process gas containing $Ru_3(CO)_{12}$ precursor vapor and CO gas for about 10 sec at substrate temperatures between about 115° C. and about 210° C. and process pressures of 500 mTorr, 100 mTorr, and 15 mTorr (milli-Torr). In a first example, traces 10A (trace data designated by solid squares) and 10B (trace data designated by open squares) show Ru metal thickness on Cu metal and low-k materials, respectively, for a process pressure in the process chamber of 15 mTorr. In a second example, traces 11A (trace data designated by solid circles) and 11B (trace data designated by open circles) show Ru thickness on Cu metal and low-k materials, respectively, for a process pressure of 100 mTorr. In a third example, traces 12A (trace data designated by solid triangles) and 12B (trace data designated by open triangles) show Ru thickness on Cu metal and low-k materials, respectively, for a process pressure of 500 mTorr. FIG. 1A shows that initial deposition of Ru metal directly on the Cu metal, as opposed to directly on the low-k material, is highly selective for wafer temperatures above about 150° C. and that the selectivity increases as a function of decreasing process pressure. This high selectivity can be used to deposit ultra-thin (a few Angstrom thick) Ru metal films on Cu and other metals.

Figure 1B:
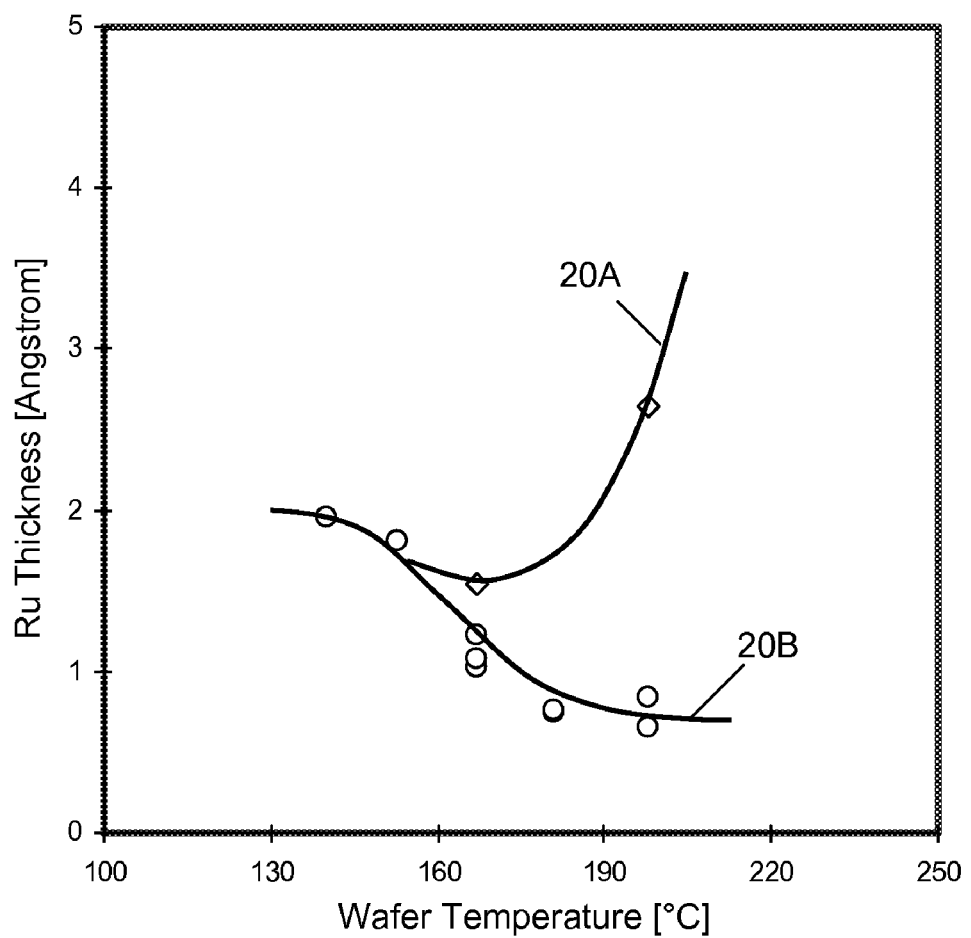
FIG. 1B shows thickness of Ru metal films deposited on a low-k material as a function of wafer temperature and pre-treating conditions according to embodiments of the invention.

FIG. 1B shows thickness of Ru metal films deposited on a low-k material (k=2.4) as a function of wafer temperature and pre-treating conditions according to embodiments of the invention. The substrates were pre-treated prior to Ru metal deposition by heat-treating in $H_2$ gas with and without plasma exposure for 1 min at a process pressure of 3 Torr. The pre-treating was performed in a plasma process chamber containing a slotted plane antenna (SPA), as described in U.S. Pat. No. 5,024,716, entitled "Plasma processing apparatus for etching, ashing, and film-formation"; the contents of which are herein incorporated by reference in its entirety.

Following the pre-treating, the Ru metal films were deposited using a process gas containing $Ru_3(CO)_{12}$ precursor vapor and CO gas and process pressure of 100 mTorr. Trace 20A (trace data designated by open diamonds) shows Ru film thickness on substrates pre-treated with plasma excited $H_2$ gas and trace 20B (same as trace 10A in FIG. 1A; trace data designated by open circles) shows Ru film thickness on substrates pre-treated with $H_2$ gas without plasma excitation. FIG. 1B shows that pre-treating the low-k material with plasma excited $H_2$ gas significantly increases the initial Ru metal film deposition rate compared to substrates pre-treated with $H_2$ gas without plasma excitation. The current inventors believe that the pre-treating with plasma excited $H_2$ gas activates an exposed surface of the low-k material, thereby reducing the incubation time for Ru metal deposition on the activated low-k material and reducing selectivity of the Ru metal deposition on the different materials.

Adsorption of $Ru_3(CO)_{12}$ precursor vapor on a wafer (substrate) surface is thought to result in partial decomposition of the $Ru_3(CO)_{12}$ precursor to adsorbed $Ru_3(CO)_x$ and CO species on the surface, followed by further decomposition of adsorbed $Ru_3(CO)_x$ to Ru metal and CO that desorbs from the substrate.

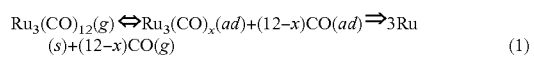

$$Ru_3(CO)_{12}(g) \Leftrightarrow Ru_3(CO)_x(ad) + (12-x)CO(ad) \Rightarrow 3Ru(s) + (12-x)CO(g) \quad (1)$$

Although not wishing to be bound by theory, the current inventors believe that the selective deposition of Ru metal observed on a metal surface such as Cu or tungsten (W) is at least in part due to higher concentration of adsorbed CO on dielectric surfaces than on the metal surface, thereby favoring recombination of adsorbed CO with $Ru_3(CO)_x$ to reform $Ru_3(CO)_{12}$ in Equation (1) on the dielectric surfaces. The lower concentration of adsorbed CO on metal surfaces leads to higher rate of decomposition of adsorbed $Ru_3(CO)_x$ to Ru metal and CO than on the dielectric surfaces.

Embodiments of the invention provide a system and method for highly selective low-temperature deposition of Ru metal films on pre-treated metal surfaces (e.g., Cu metal) in patterned substrates. The patterned substrates can contain high-aspect-ratio recessed features. According to one embodiment of the invention, a dual damascene interconnect structure contains a trench and a via formed in the patterned substrate, where the trench and the via contain sidewalls and bottoms. The via can have an aspect ratio (depth/width) greater than or equal to about 2:1, for example 3:1, 4:1, 5:1, 6:1, 12:1, 15:1, or higher. The via can have widths of about 200 nm or less, for example 150 nm, 100 nm, 65 nm, 45 nm, 32 nm, 20 nm, or lower. However, embodiments of the invention are not limited to these aspect ratios or via widths, as other aspect ratios or via widths may be utilized.

Figure 2A:
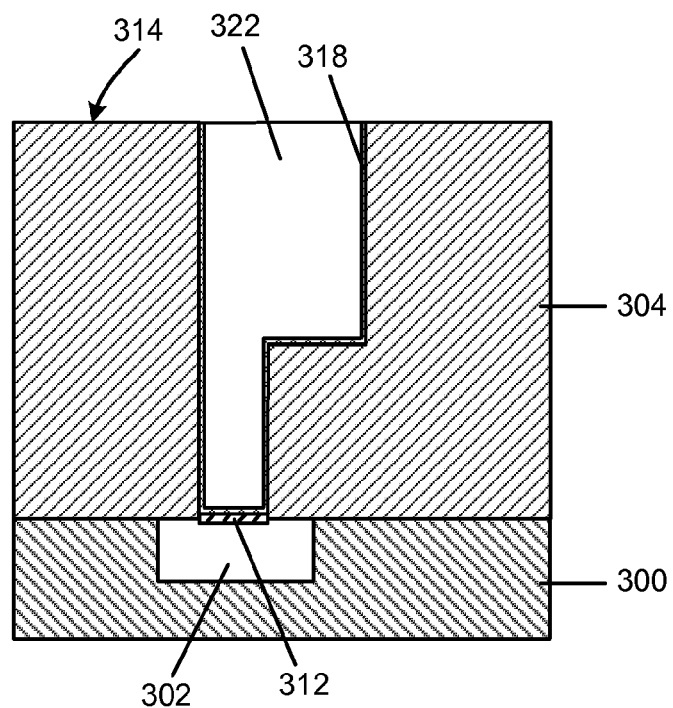
FIGS. 2A-2D show schematic cross-sectional views of integration of selectively deposited Ru metal films in a dual damascene interconnect structure according to an embodiment of the invention.

FIG. 2A shows a schematic cross-sectional view of a dual damascene interconnect structure according to an embodiment of the invention. The dual damascene interconnect structure is filled with planarized bulk Cu metal 322, which can be formed by filling the dual damascene interconnect structure with bulk Cu metal and removing excess Cu metal using a planarizing process, for example a chemical mechanical polishing (CMP) process. The planarization process further removes a barrier layer 318 from the field surface 314 as schematically shown in FIG. 2A. Bulk Cu metal deposition processes are well known to one of ordinary skill in the art of circuit fabrication and can, for example, include an electrochemical plating process or an electroless plating process. Furthermore, CMP processes are well known to one of ordinary skill in the art.

In FIG. 2A, the barrier layer 318 can, for example, contain a Ta-containing layer (e.g., Ta, TaC, TaN, or TaCN, or a combination thereof), a Ti-containing layer (e.g., Ti, TiN, or a combination thereof), or a W-containing layer (e.g., W, WN, or a combination thereof). In one example, the barrier layer 318 may contain TaCN deposited in a plasma enhanced atomic layer deposition (PEALD) system using alternating exposures of tertiary amyl imido-tris-dimethylamido tantalum $(Ta(NC(CH_3)_2C_2H_5)(N(CH_3)_2)_3)$ and $H_2$.

In FIG. 2A, the dual damascene interconnect structure further contains a first metallization layer 302 (e.g., Cu or W) in a dielectric layer 300. The dielectric layer 300 can, for example, contain $SiO_2$, a low-k dielectric material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material. The dual damascene interconnect structure contains a trench and a via etched in a dielectric layer 304. The dielectric layer 304 contains a "field" surface 314 area around the dual damascene interconnect structure. Although not shown, the interconnect structure may contain additional layers, for example a trench etch stop layer, a via etch stop layer between dielectric layers 300 and 304, and a barrier layer separating the first metallization layer 302 from the dielectric layer 300. The dual damascene interconnect structure can be formed using standard lithography and etching methods known to those skilled in the art. It will be understood that embodiments of the invention may also be applied to simpler or more complicated dual damascene interconnect structures and other types of recessed features containing a metallization layer.

FIG. 2A further shows an optional metal film 312 (e.g., Ru metal film) selectively deposited onto the first metallization layer 302. According to one embodiment of the invention, a Ru film (not shown) may be conformally deposited onto the barrier layer 318 prior to the bulk Cu metal filling.

The current inventors have realized that planarization processes, for example CMP, can cause problems for further processing (e.g., selective metal deposition) of the planarized patterned substrate due to the corrosive process environment used for the planarization processes. According to embodiments of the invention, these problems may be minimized or eliminated by heat-treating the planarized patterned substrate in the presence of hydrogen ($H_2$), nitrogen ($N_2$), or ammonia ($NH_3$), or a combination thereof.

According to one embodiment of the invention, following formation of the dual damascene interconnect structure in FIG. 2A, the planarized bulk Cu metal 322 and the field surface 314 of the dielectric layer 304 are heat-treated in the presence of $H_2$, $N_2$, or $NH_3$, or a combination thereof. The heat-treating can be performed at a substrate temperature below 200° C. and may further include a noble gas such as argon (Ar). Alternately, the heat-treating can be performed at a substrate temperature between 200° C. and 400° C. In one example, pure $H_2$, pure $N_2$, or pure $NH_3$ may be used. In another example, the $H_2$, $N_2$, or $NH_3$, or combination thereof, may further contain a noble gas such as argon (Ar). In one example, a 10:1 $H_2$/Ar mixture may be used.

According to another embodiment of the invention, the heat-treating may be performed at a substrate temperature below 200° C. in the presence of $H_2$. In one example pure $H_2$ may be used. In another example, a mixture of $H_2$ and Ar may be used.

According to yet another embodiment of the invention, the heat-treating may be performed at a substrate temperature below 200° C. in the presence of $N_2$ or $NH_3$, or a combination thereof. In one example pure $N_2$ or pure $NH_3$ may be used. In another example, a mixture of $N_2$ and Ar, or $NH_3$ and Ar, or $N_2$, $NH_3$, and Ar may be used.

Figure 2B:
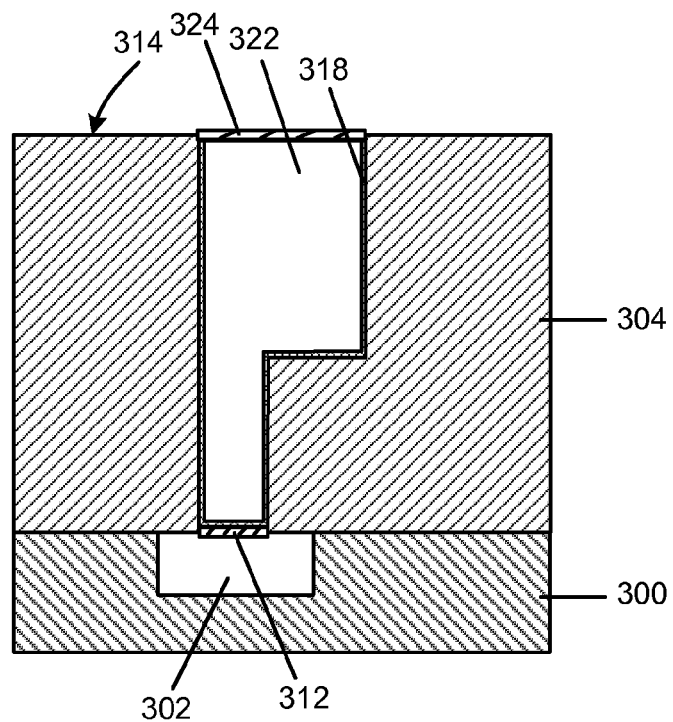
Figure 2C:
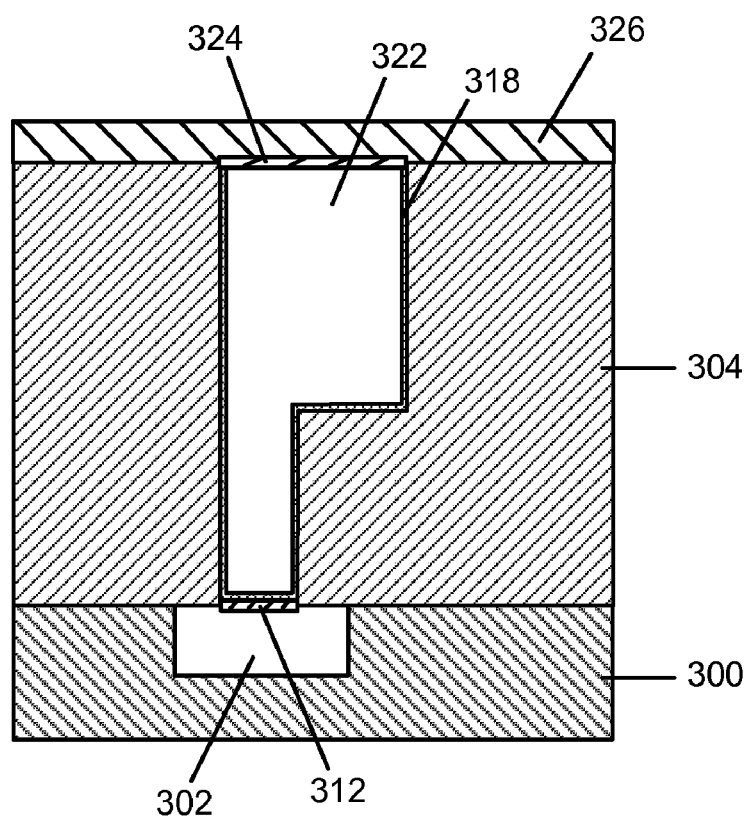
Figure 2D:
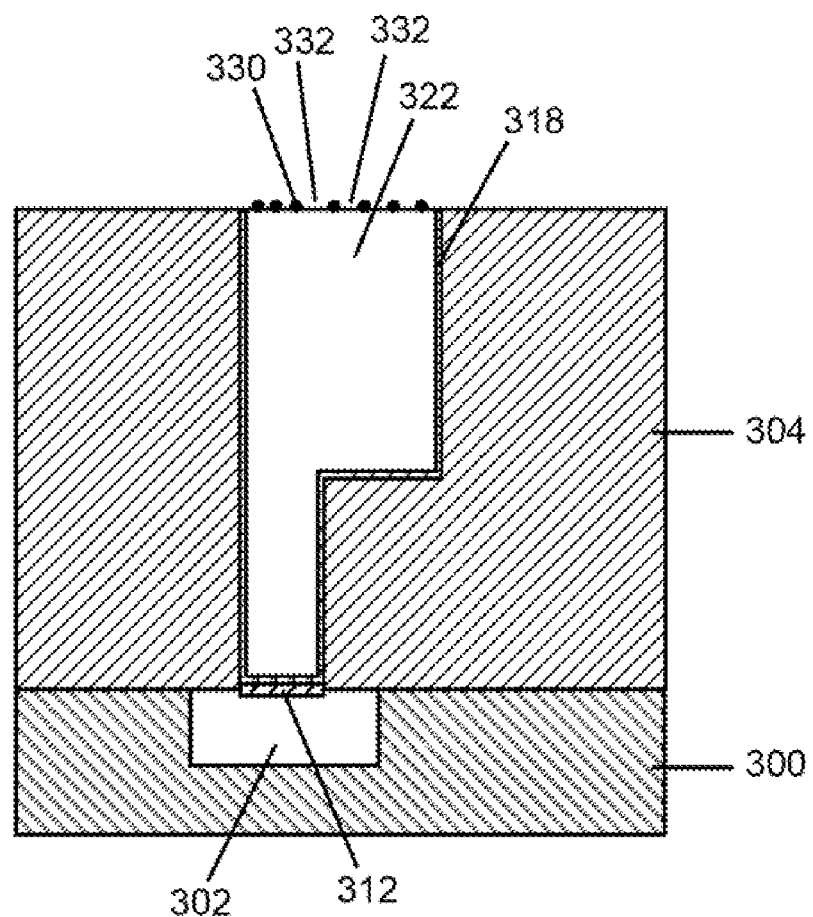

Following the heat-treating, a Ru metal film 324 is selectively deposited on the heat-treated planarized bulk Cu metal 322, as shown in FIG. 2B. The Ru metal film 324 can be deposited at a substrate temperature between 100° C. and 300° C. According to one embodiment of the invention, the heat-treating and the Ru metal film deposition may both be performed at a substrate temperature below 200° C. The Ru metal film 324 can be deposited in a TCVD process using a process gas containing $Ru_3(CO)_{12}$ precursor vapor and a CO gas. In one embodiment, an average thickness of the Ru metal film 324 can be between 2 and 20 Angstrom, or between 5 and 15 Angstrom, for example about 10 Angstrom. In one embodiment, an average thickness of the Ru metal film 324 can be less than 10 Angstrom. According to one embodiment, as depicted in FIG. 2D, a surface coverage of the Ru metal film 330 on the planarized bulk Cu metal 322 is incomplete with gaps 332 that expose the planarized bulk Cu metal 322. According to one embodiment, the heat-treating and the Ru metal film deposition may be performed in the same process chamber. Alternately, the heat-treating and the Ru metal film deposition may be performed in different process chambers.

Following selective deposition of the Ru metal film 324 on the planarized bulk Cu metal 322, the partially manufactured semiconductor device depicted in FIG. 2B is further processed. FIG. 2C shows a conformal cap layer 326 deposited on the Ru metal film 324 and on the dielectric layer 304. The cap layer 326 can, for example, contain silicon nitride or silicon carbon nitride. In other examples, the cap layer 326 can contain a metal nitride, for example, CuSiN, WN, TiN, or CoN. According to one embodiment of the invention, prior to depositing the cap layer 326, the Ru metal film and the dielectric layer may be heat-treated at a substrate temperature between 150° C. and 400° C. in the presence of $H_2$, $N_2$, or $NH_3$, or a combination thereof.

Figure 3:
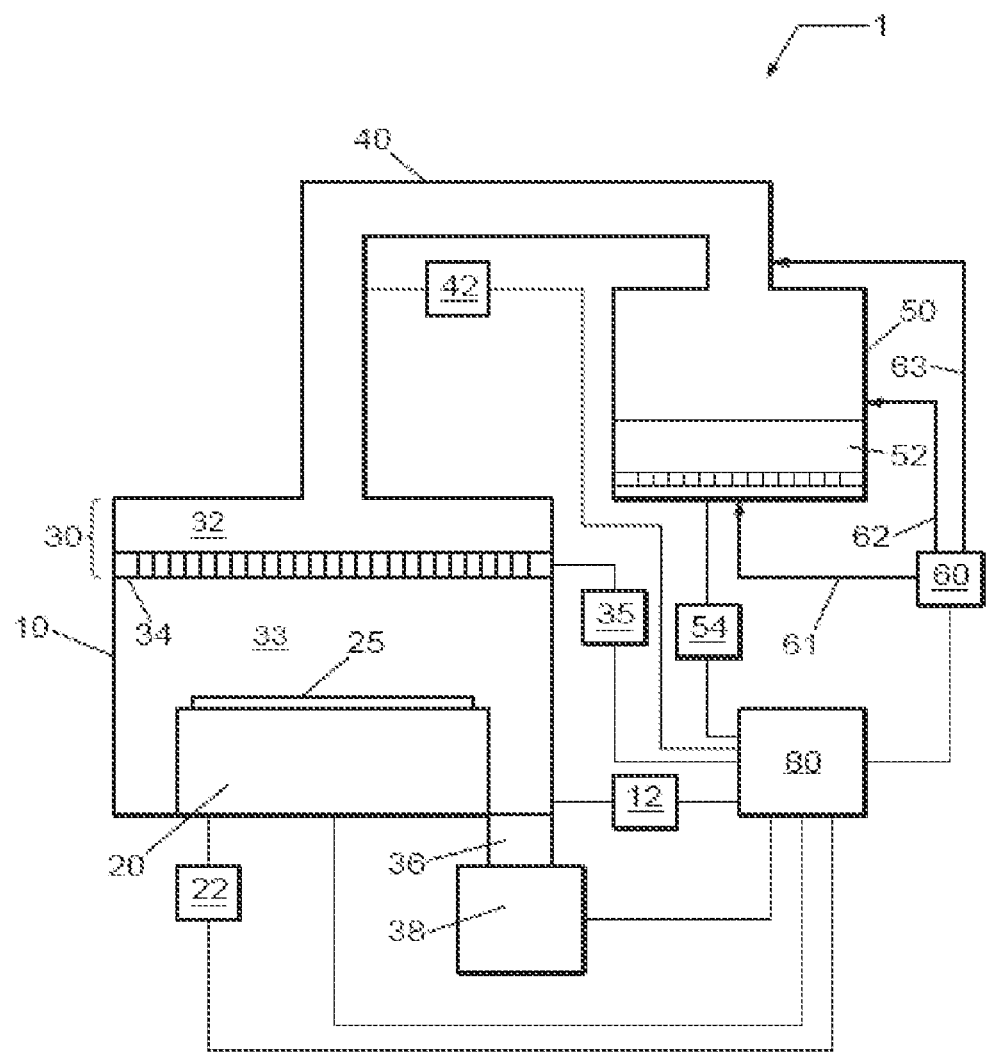
FIG. 3 depicts a schematic view of a thermal chemical vapor deposition (TCVD) system for depositing a Ru metal film according to an embodiment of the invention.

FIG. 3 depicts a schematic view of a thermal chemical vapor deposition (TCVD) system for depositing a Ru metal film from a $Ru_3(CO)_{12}$ precursor vapor and a CO gas according to an embodiment of the invention. The deposition system 1 includes a process chamber 10 having a substrate holder 20 configured to support a patterned substrate 25 upon which the Ru metal film is formed. The process chamber 10 is coupled to a metal precursor vaporization system 50 via a vapor precursor delivery system 40.

The process chamber 10 is further coupled to a vacuum pumping system 38 through a duct 36, wherein the vacuum pumping system 38 is configured to evacuate the process chamber 10, vapor precursor delivery system 40, and metal precursor vaporization system 50 to a pressure suitable for forming the Ru metal film on the patterned substrate 25, and suitable for vaporization of the $Ru_3(CO)_{12}$ precursor 52 in the metal precursor vaporization system 50.

Still referring to FIG. 3, the metal precursor vaporization system 50 is configured to store a $Ru_3(CO)_{12}$ precursor 52, to heat the $Ru_3(CO)_{12}$ precursor 52 to a temperature sufficient for vaporizing the $Ru_3(CO)_{12}$ precursor 52, and to introduce $Ru_3(CO)_{12}$ precursor vapor to the vapor precursor delivery system 40. The $Ru_3(CO)_{12}$ precursor 52 is a solid under the selected heating conditions in the metal precursor vaporization system 50. In order to achieve the desired temperature for subliming the solid $Ru_3(CO)_{12}$ precursor 52, the metal precursor vaporization system 50 is coupled to a vaporization temperature control system 54 configured to control the vaporization temperature.

For instance, the temperature of the $Ru_3(CO)_{12}$ precursor 52 may be elevated to between approximately 40° C. to approximately 150° C. Alternately, the vaporization temperature can be maintained at approximately 60° C. to approximately 90° C. As the $Ru_3(CO)_{12}$ precursor 52 is heated to cause sublimation, a CO-containing gas is passed over or through the $Ru_3(CO)_{12}$ precursor 52 to capture the $Ru_3(CO)_{12}$ precursor vapor as it is being formed. The CO-containing gas contains CO and optionally an inert carrier gas, such as $N_2$, or a noble gas (i.e., He, Ne, Ar, Kr, or Xe), or a combination thereof. Vaporizing the $Ru_3(CO)_{12}$ precursor in the presence of CO gas can reduce problems that limit the delivery of the $Ru_3(CO)_{12}$ precursor vapor to the patterned substrate. It has been shown that addition of the CO gas to the $Ru_3(CO)_{12}$ precursor vapor as it is being formed allows for increasing the vaporization temperature. The elevated temperature increases the vapor pressure of the $Ru_3(CO)_{12}$ precursor, resulting in increased delivery of the $Ru_3(CO)_{12}$ precursor to the process chamber and, hence, increased deposition rate of a Ru metal film on the patterned substrate 25. The use of a CO gas to reduce premature decomposition of the $Ru_3(CO)_{12}$ precursor in the vapor precursor delivery system 40 prior to delivery of the $Ru_3(CO)_{12}$ precursor to the process chamber 10 has been shown to facilitate efficient transfer of $Ru_3(CO)_{12}$ precursor vapor to a process chamber to deposit Ru metal film has been described in U.S. patent application Ser. No. 10/996,145, titled "Method for Increasing Deposition Rates of Metal Layers from Metal-carbonyl Precursors", filed on Nov. 23, 2004, the entire contents of which is incorporated herein by reference.

In one example, the metal precursor vaporization system 50 may be a multi-tray vaporization system configured for efficient evaporation and transport of the $Ru_3(CO)_{12}$ vapor. An exemplary multi-tray vaporization system is described in U.S. patent application Ser. No. 10/998,420, titled "Multi-Tray Film Precursor Evaporation System and Thin Film Deposition System Incorporating Same", filed on Nov. 29, 2004.

For example, a gas supply system 60 is coupled to the metal precursor vaporization system 50, and it is configured to, for instance, supply CO, a carrier gas, or a mixture thereof, beneath the $Ru_3(CO)_{12}$ precursor 52 via feed line 61, or over the $Ru_3(CO)_{12}$ precursor 52 via feed line 62. In addition, the gas supply system 60 is coupled to the vapor precursor delivery system 40 downstream from the metal precursor vaporization system 50 to supply the gas to the vapor of the $Ru_3(CO)_{12}$ precursor 52 via feed line 63 as or after it enters the vapor precursor delivery system 40. Furthermore, the feed line 63 may be utilized to pre-treat the patterned substrate 25 with a pre-treatment gas containing CO gas to saturate the exposed surfaces of the patterned substrate 25 with adsorbed CO prior to exposing the patterned substrate 25 to $Ru_3(CO)_{12}$ precursor vapor and CO gas.

Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 500 sccm. Still alternately, the flow rate of the CO-containing gas can be between about 50 sccm and about 200 sccm. According to embodiments of the invention, the flow rate of the CO-containing gas can range from approximately 0.1 sccm to approximately 1000 sccm. Alternately, the flow rate of the CO-containing gas can be between about 1 sccm and about 500 sccm.

Downstream from the metal precursor vaporization system 50, the process gas containing the $Ru_3(CO)_{12}$ precursor vapor and CO gas flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the $Ru_3(CO)_{12}$ precursor vapor as well as condensation of the $Ru_3(CO)_{12}$ precursor vapor. The vapor precursor delivery system 40 can, for example, be maintained at a temperature between 50° C. and 100° C.

Still referring to FIG. 3, the vapor distribution system 30, which forms part of and is coupled to the process chamber 10, comprises a vapor distribution plenum 32 within which the vapor disperses prior to passing through a vapor distribution plate 34 and entering a processing zone 33 above the patterned substrate 25. In addition, the vapor distribution plate 34 can be coupled to a distribution plate temperature control system 35 configured to control the temperature of the vapor distribution plate 34.

Once the process gas containing the $Ru_3(CO)_{12}$ precursor vapor and CO gas enters the processing zone 33 of process chamber 10, the $Ru_3(CO)_{12}$ precursor vapor thermally decomposes upon adsorption at the substrate surface due to the elevated temperature of the patterned substrate 25, and a Ru metal film is formed on the patterned substrate 25. The substrate holder 20 is configured to elevate the temperature of the patterned substrate 25 by virtue of the substrate holder 20 being coupled to a substrate temperature control system 22. For example, the substrate temperature control system 22 can be configured to elevate the temperature of the patterned substrate 25 up to approximately 500° C. Additionally, the process chamber 10 can be coupled to a chamber temperature control system 12 configured to control the temperature of the chamber walls.

Still referring to FIG. 3, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 4:
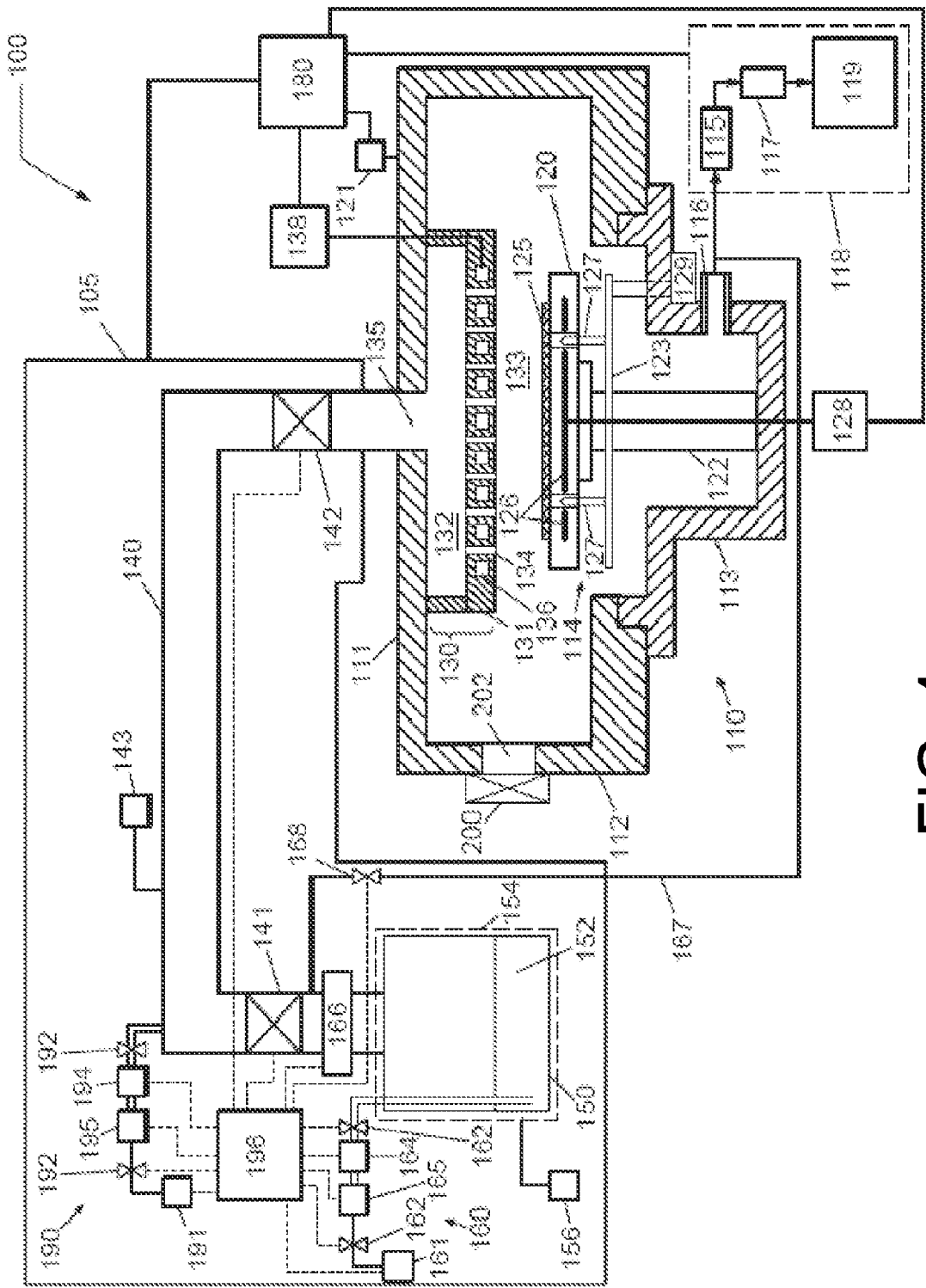
FIG. 4 depicts a schematic view of another TCVD system for depositing a Ru metal film according to another embodiment of the invention.

FIG. 4 depicts a schematic view of another TCVD system for depositing a Ru metal film from a $Ru_3(CO)_{12}$ precursor vapor and a CO gas according to an embodiment of the invention. The deposition system 100 comprises a process chamber 110 having a substrate holder 120 configured to support a patterned substrate 125 upon which the Ru metal film is formed. The process chamber 110 is coupled to a precursor delivery system 105 having metal precursor vaporization system 150 configured to store and vaporize a $Ru_3(CO)_{12}$ precursor 152, and a vapor precursor delivery system 140 configured to transport the vapor of the $Ru_3(CO)_{12}$ precursor 152 to the process chamber 110.

The process chamber 110 comprises an upper chamber section 111, a lower chamber section 112, and an exhaust chamber 113. An opening 114 is formed within lower chamber section 112, where lower chamber section 112 couples with exhaust chamber 113.

Still referring to FIG. 4, substrate holder 120 provides a horizontal surface to support a patterned substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the patterned substrate 125 or substrate holder 120.

During processing, the heated patterned substrate 125 can thermally decompose the $Ru_3(CO)_{12}$ precursor vapor, and enable deposition of a Ru metal film on the patterned substrate 125. The substrate holder 120 is heated to a pre-determined temperature that is suitable for depositing the desired Ru metal film onto the patterned substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 500 mTorr. Alternately, the process chamber pressure can be between about 10 mTorr and about 100 mTorr.

Also shown in FIG. 4, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above the patterned substrate 125 through one or more orifices 134.

Furthermore, an opening 135 is provided in the upper chamber section 111 for introducing a process gas containing $Ru_3(CO)_{12}$ precursor vapor and CO gas from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the $Ru_3(CO)_{12}$ precursor vapor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the vapor distribution plate 131.

As illustrated in FIG. 4, a metal precursor vaporization system 150 is configured to hold a $Ru_3(CO)_{12}$ precursor 152 and to evaporate (or sublime) the $Ru_3(CO)_{12}$ precursor 152 by elevating the temperature of the $Ru_3(CO)_{12}$ precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the $Ru_3(CO)_{12}$ precursor 152 to maintain the $Ru_3(CO)_{12}$ precursor 152 at a temperature that produces a desired vapor pressure of $Ru_3(CO)_{12}$ precursor 152. The precursor heater 154 is coupled to a vaporization temperature control system 156 configured to control the temperature of the $Ru_3(CO)_{12}$ precursor 152. For example, the precursor heater 154 can be configured to adjust the temperature of the $Ru_3(CO)_{12}$ precursor 152 from about 40° C. to about 150° C., or from about 60° C. to about 90° C.

As the $Ru_3(CO)_{12}$ precursor 152 is heated to cause evaporation (or sublimation), a CO-containing gas can be passed over or through the $Ru_3(CO)_{12}$ precursor 152 to capture the $Ru_3(CO)_{12}$ precursor vapor as it is being formed. The CO-containing gas contains CO and optionally an inert carrier gas, such as $N_2$, or a noble gas (i.e., He, Ne, Ar, Kr, Xe). For example, a gas supply system 160 is coupled to the metal precursor vaporization system 150, and it is configured to, for instance, flow the CO gas over or through the $Ru_3(CO)_{12}$ precursor 152. Although not shown in FIG. 4, gas supply system 160 can also be coupled to the vapor precursor delivery system 140 to supply the CO gas to the vapor of the metal precursor 152 as or after it enters the vapor precursor delivery system 140, for example, to pre-treat the patterned substrate 125 with a pre-treatment gas containing CO gas to saturate the exposed surfaces of the patterned substrate 125 with adsorbed CO prior to exposing the patterned substrate 125 to a process gas containing $Ru_3(CO)_{12}$ precursor vapor and CO gas.

The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of $Ru_3(CO)_{12}$ precursor vapor delivered to the process chamber 110 can be determined using sensor 166 and mass flow controller 165. Alternately, the sensor 166 can comprise a light absorption sensor to measure the concentration of the $Ru_3(CO)_{12}$ precursor in the gas flow to the process chamber 110.

A bypass line 167 can be located downstream from sensor 166, and it can connect the vapor precursor delivery system 140 to an exhaust line 116. Bypass line 167 is provided for evacuating the vapor precursor delivery system 140, and for stabilizing the supply of the $Ru_3(CO)_{12}$ precursor vapor and CO gas to the process chamber 110. In addition, a bypass valve 168, located downstream from the branching of the vapor precursor delivery system 140, is provided on bypass line 167.

Referring still to FIG. 4, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the $Ru_3(CO)_{12}$ precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, pre-treat the patterned substrate 125 with a pre-treatment gas containing a CO gas or mix additional CO gas with the $Ru_3(CO)_{12}$ precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the $Ru_3(CO)_{12}$ precursor vapor. Sensor 166 is also connected to controller 196 and, based on output of the sensor 166, controller 196 can control the carrier gas flow through mass flow controller 165 to obtain the desired $Ru_3(CO)_{12}$ precursor flow to the process chamber 110.

As illustrated in FIG. 4, the exhaust line 116 connects exhaust chamber 113 to vacuum pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted $Ru_3(CO)_{12}$ precursor material and by-products from the process chamber 110.

Referring back to the substrate holder 120 in the process chamber 110, as shown in FIG. 4, three substrate lift pins 127 (only two are shown) are provided for holding, raising, and lowering the patterned substrate 125. The substrate lift pins 127 are coupled to plate 123, and can be lowered to below the upper surface of substrate holder 120. A drive mechanism 129 utilizing, for example, an air cylinder provides means for raising and lowering the plate 123. The patterned substrate 125 can be transferred into and out of process chamber 110 through gate valve 200 and chamber feed-through passage 202 via a robotic transfer system (not shown), and received by the substrate lift pins 127. Once the patterned substrate 125 is received from the transfer system, it can be lowered to the upper surface of the substrate holder 120 by lowering the substrate lift pins 127.

Still referring to FIG. 4, a deposition system controller 180 includes a microprocessor, a memory, and a digital I/O port capable of generating control voltages sufficient to communicate and activate inputs of the deposition system 100 as well as monitor outputs from the deposition system 100. Moreover, the controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate holder temperature control system 128. In the vacuum pumping system 118, the controller 180 is coupled to and exchanges information with the APS 115 for controlling the pressure in the process chamber 110. A program stored in the memory is utilized to control the aforementioned components of the deposition system 100 according to a stored process recipe.

The controller 180 may be implemented as a general purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet or a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

A plurality of embodiments for integrating low-temperature selective Ru deposition into manufacturing of semiconductor devices to improve EM and SM in Cu metallization has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
    providing a patterned substrate containing a recessed feature in a dielectric layer, the recessed feature at least substantially filled with planarized bulk Cu metal;
    heat-treating the planarized bulk Cu metal and the dielectric layer in the presence of $H_2$, $N_2$, or $NH_3$, or a combination thereof; and
    selectively depositing a Ru metal film on the heat-treated planarized bulk Cu metal, wherein surface coverage of the Ru metal film on the planarized bulk Cu metal is incomplete with gaps that expose the planarized bulk Cu metal.

2. The method of claim 1, wherein the heat-treating and depositing are performed at a substrate temperature below 200° C.

3. The method of claim 1, wherein the depositing is performed at a substrate temperature between 100° C. and 300° C.

4. The method of claim 1, wherein the heat-treating is performed at a substrate temperature below 200° C.

5. The method of claim 1, wherein the heat-treating is performed at a substrate temperature between 200° C. and 400° C.

6. The method of claim 1, wherein a thickness of the Ru metal film is between 1 Angstrom and 30 Angstrom.

7. The method of claim 1, wherein a thickness of the Ru metal film is less than 10 Angstrom.

8. The method of claim 1, wherein selectively depositing the Ru metal film comprises:
    forming a process gas containing $Ru_3(CO)_{12}$ precursor vapor and a CO gas, the form comprising:
        heating a solid $Ru_3(CO)_{12}$ precursor in a precursor evaporation system to a temperature between about 40° C. and about 150° C. and maintaining the solid $Ru_3(CO)_{12}$ precursor at the temperature to form the $Ru_3(CO)_{12}$ precursor vapor, and
        flowing the CO gas in contact with the solid $Ru_3(CO)_{12}$ precursor in the precursor evaporation system during the heating to capture the $Ru_3(CO)_{12}$ precursor vapor in the CO gas as the vapor is being formed; and
        transporting the process gas from the precursor evaporation system to a process chamber containing the patterned substrate; and
    exposing the patterned substrate to the process gas in a thermal chemical vapor deposition process.

9. The method of claim 1, wherein the recessed feature comprises one or more trenches and one or more vias.

10. The method of claim 1, wherein the patterned substrate further comprises a barrier layer in the recessed feature.

11. The method of claim 1, further comprising:
    depositing a conformal cap layer on the Ru metal film and the dielectric layer.

12. The method of claim 11, further comprising:
    prior to depositing the cap layer, heat-treating the Ru metal film and the dielectric layer at a substrate temperature between 150° C. and 400° C. in the presence of $H_2$, $N_2$, or $NH_3$, or a combination thereof.

13. A method of forming a semiconductor device, comprising:
    providing a patterned substrate containing a recessed feature in a dielectric layer, the recessed feature at least substantially filled with planarized bulk Cu metal;
    heat-treating the planarized bulk Cu metal and the dielectric layer at a substrate temperature below 200° C. in the presence of $H_2$; and
    selectively depositing a Ru metal film on the heat-treated planarized bulk Cu metal by exposing the patterned substrate to the process gas containing $Ru_3(CO)_{12}$ precursor vapor and a CO gas in a thermal chemical vapor deposition process, wherein surface coverage of the Ru metal film on the planarized bulk Cu metal is incomplete with gaps that expose the planarized bulk Cu metal.

14. The method of claim 13, further comprising:
    depositing a conformal cap layer on the Ru metal film and the dielectric layer.

15. The method of claim 13, wherein a thickness of the Ru metal film is between 2 and 30 Angstrom.

16. The method of claim 14, further comprising:

prior to depositing the cap layer, heat-treating the Ru metal film and the dielectric layer at a temperature between about 150° C. and about 400° C. in the presence of $H_2$, $N_2$, or $NH_3$, or a combination thereof.

17. A method of forming a semiconductor device, comprising:

providing a patterned substrate containing a recessed feature in a dielectric layer, the recessed feature at least substantially filled with planarized bulk Cu metal;

heat-treating the planarized bulk Cu metal and the dielectric layer in the presence of $N_2$ or $NH_3$, or combination thereof; and selectively depositing a Ru metal film on the heat-treated planarized bulk Cu metal by exposing the patterned substrate to the process gas containing $Ru_3(CO)_{12}$ precursor vapor and a CO gas in a thermal chemical vapor deposition process, wherein surface coverage of the Ru metal film on the planarized bulk Cu metal is incomplete with gaps that expose the planarized bulk Cu metal.

18. The method of claim 17, further comprising depositing a conformal cap layer on the Ru metal film and the dielectric layer.

19. The method of claim 18, further comprising:

prior to depositing the cap layer, heat-treating the Ru metal film and the dielectric layer at a substrate temperature between 150° C. and 400° C. in the presence of $H_2$, $N_2$, or $NH_3$, or a combination thereof.

* * * * *